United States Patent [19]

Arimoto et al.

[11] Patent Number: 4,947,376

[45] Date of Patent: Aug. 7, 1990

[54] CHARGE-TRANSFER SENSE AMPLIFIER FOR DRAM AND OPERATING METHOD THEREFOR

[75] Inventors: Kazutami Arimoto; Kiyohiro Furutani, both of Hyogo, Japan

[73] Assignee: Mitsubishi Denki Kabushiki Kaisha, Tokyo, Japan

[21] Appl. No.: 214,253

[22] Filed: Jul. 1, 1988

[30] Foreign Application Priority Data

Jul. 2, 1987 [JP] Japan .............................. 62-167163

[51] Int. Cl.$^5$ .............................................. G11C 7/00
[52] U.S. Cl. ..................................... 365/205; 365/203; 307/530
[58] Field of Search ............... 365/203, 205, 190, 210, 365/149; 307/530

[56] References Cited

U.S. PATENT DOCUMENTS

| | | | |
|---|---|---|---|
| 4,039,861 | 8/1977 | Heller et al. | 307/530 |
| 4,262,341 | 4/1981 | Mogi et al. | 307/530 |
| 4,802,130 | 1/1989 | Soneda | 365/205 |

OTHER PUBLICATIONS

Tolley et al., "72-K RAM Stands up to Soft and Hard Errors", Electronics, Jun. 16, 1982, pp. 147-151.
Crabtree et al., "Charge-Sensitive Sense Amplifier", IBM Tech. Disc. Bull., vol. 21, No. 9, Feb. 1979, pp. 3707-3709.
Schuster, "High Performance Sense Amplifier Circuit", IBM Tech. Disc. Bull., vol. 21, No. 2, Jul. 1978, pp. 882-883.
IEEE J. of Sol. St. Circuits: "High Sensitivity Charge-Transfer Sense Amplifier", by Lawrence G. Heller et al., vol. SC-11, No. 5, Oct. 1974, pp. 596-601.

Primary Examiner—Glenn A. Gossage
Attorney, Agent, or Firm—Lowe, Price, LeBlanc, Becker & Shur

[57] ABSTRACT

A charge-transfer sense amplifier which is connected to a pair of bit lines includes a flip-flop type sense amplifier comprising cross-coupled transistors, a pair of charge transfer elements provided between the flip-flop type sense amplifier and the pair of bit lines, and elements for precharging nodes between the charge transfer elements and the flip-flop type sense amplifier to an "H" level. There is additionally provided a pair of coupling capacitances for capacitively coupling respective gates of the charge transfer elements to a pair of bit lines in a cross-coupling configuration. A circuit device for precharging respective gates of the charge transfer elements brings the charge transfer elements into substantially a cut-off state. This configuration enables the charge-transfer sense amplifier and a one-half Vcc precharge scheme to be effectively combined.

7 Claims, 5 Drawing Sheets

CHARGE-TRANSFER SENSE AMPLIFIER FOR DRAM AND OPERATING METHOD THEREFOR

BACKGROUND OF THE INVENTION

1. Field of the Invention

The present invention relates generally to a charge-transfer sense amplifier, and more particularly, to the structure of a charge-transfer sense amplifier available in a DRAM (Dynamic Random Access Memory) with a half Vcc precharge scheme, and an operating method therefor.

2. Description of the Prior Art

As a device for storing binary information, a random access memory employing a semiconductor has been known. The random access memory has a configuration as shown in FIG. 1, which is integrated on a semiconductor chip.

Referring to FIG. 1, a dynamic random access memory comprises a memory cell array MA comprising a plurality of memory cells for storing binary information. An address buffer AB generates an internal row address and an internal column address from an external address externally applied. A row decoder RD is responsive to the internal row address from the address buffer AB for selecting one row (a word line) from the memory cell array MA, and a column decoder CD is responsive to the internal column address from the address buffer AB for selecting one column (a pair of bit lines) from the memory cell array MA for memory cell selection. A sense amplifier and I/O gate (block S) comprises sense amplifiers for detecting and amplifying information in the memory cells connected to the word line selected by an output of a row decoder RD. An I/O gate is provided for connecting one column selected by an output of the column decoder CD to a data input-/output bus I/O, and an output buffer OB is responsive to data on the data input/output bus I/O for applying output data $D_{OUT}$ to the exterior. An input buffer IB transmits input data $D_{IN}$ externally applied onto the data input/output bus I/O for accessing a selected memory. A control signal generator CG is also provided for generating signals for controlling an operation sequence of each circuit.

In FIG. 1, the bit lines (forming columns) included in the memory cell array MA have a folded bit line scheme, so that complementary data D and $\overline{D}$ appear on the data input/output bus I/O.

The external row address and the external column address are multiplexed, to be applied to the address buffer AB.

Each memory cell in such a DRAM has a one-device structure comprising one transistor and one capacitor. Binary information is stored in the capacitor in the form of electric charges.

In recent years, as the capacity of the DRAM is increased, the integration density on a chip is enhanced. The memory cell size is responsively scaled down. In this case, the number of memory cells connected to one bit line is increased so that the parasitic capacitance of the bit line is increased while the storage capacitance of the memory cell is decreased. As a result, the ratio $C_B/C_S$ of the capacitance $C_B$ of the bit line to the storage capacitance $C_S$ of the memory cell becomes large. Consequently, a potential shift which appears on the bit line at the time of reading out information becomes smaller. Thus, a differential signal applied to a flip-flop type sense amplifier becomes smaller, so that the sense amplifier can not surely detect read information.

In order to compensate for such diminution of the differential signal in the large capacity DRAM, a charge-transfer sense amplifier has been proposed by L. G. Heller et al. See, for example, an article by L. G. Heller et al., entitled "High Sensitivity Charge-Transfer Sense Amplifier", IEEE Journal of Solid-State Circuits, Vol. SC-11, No. 5, October 1976, pp. 596-601.

FIG. 2 is a diagram of a structure of the charge-transfer sense amplifier, showing by way of example a pair of bit lines and portions related thereto.

The bit lines shown in FIG. 2 have a folded bit line configuration. More specifically, a first bit line 1a and a second bit line 1b are paired with each other, complementary data signals appearing on the bit lines.

A memory cell array MA includes a plurality of memory cells arranged in a matrix of rows and columns and dummy cells for providing a reference at the time of detecting data signals. In FIG. 2, two memory cells 2a and 2b are typically shown. Each of the memory cells comprises one transfer gate transistor and one storage capacitor. The memory cell 2a comprises a capacitor C4, a transistor Q11 and a word line WL1, and the memory cell 2b comprises a capacitor C3, a transistor Q12 and a word line WL2. A dummy cell 3a comprises a capacitor C1, a transistor Q9 and a dummy word line DWL1, and a dummy cell 3b comprises a capacitor C2, a transistor Q10 and a dummy word line DWL2. Capacitances of respective capacitors C1 and C2 in the dummy cells 3a and 3b are set to one-half of a capacitance of the storage capacitor, and information of an "L" level, i.e., 0 V is always stored in the capacitors C1 and C2 in the dummy cells 3a and 3b. The transistor Q11 in the memory cell 2a and the transistor Q9 in the dummy cell 3a are connected to a first bit line 1a, and the transistor Q12 in the memory cell 2b and the transistor Q10 in the dummy cell 3b are connected to a second bit line 1b. The first bit line 1a and the second bit line 1b are in a complementary relation. However, both the first bit line 1a and the second bit line 1b are always precharged to the same potential Vcc in the initial stage of a read operation. $C_{Ba}$ denotes a parasitic capacitance of the first bit line 1a, and $C_{Bb}$ denotes a parasitic capacitance of the second bit line 1b.

A sense amplifier SA includes charge transfer elements Q3 and Q4 and a flip-flop type sense amplifier comprising cross-coupled transistors Q6 and Q7.

The charge transfer elements Q3 and Q4 provided on the bit lines 1a and 1b, respectively, comprise a MOS transistor. Each gate thereof is connected to a constant voltage supply $V_{R1}$ ($V_{R1} \approx Vcc + Vthn$; Vthn denotes a threshold voltage of each of the transistors Q3 and Q4).

An equalize transistor Q5 responsive to a clock $\phi 3$ is provided between nodes N1 and N2.

In order to activate the flip-flop type sense amplifier, there is provided a MOS transistor Q8 responsive to a clock $\phi 2$ for grounding a node N3.

In order to precharge the nodes N1 and N2 to a predetermined potential $V_H$ ($V_H > V_C$; approximately 7 V), there are provided MOS transistors Q1 and Q2 responsive to a clock $\phi 1$, respectively. The high level of the clock $\phi 1$ satisfies the relation $\phi 1h > V_H + Vthn$.

The first node N1 has a parasitic capacitance $C_{Sa}$, and the second node N2 has a parasitic capacitance $C_{Sb}$.

The first and second bit lines 1a and 1b are connected to data input/output buses I/O and $\overline{I/O}$ through transfer gates T1 and T2 responsive to an output (a column decode signal) of a column decoder CD, respectively.

Referring now to the timing chart of FIG. 3, description is made of a read operation in the conventional charge-transfer sense amplifier.

[1] Reading out stored information of "H" level

It is assumed that information of the "H" level, i.e., Vcc is stored in the capacitor C4 in the memory cell 2a, and the content thereof is read out. It is also assumed that the threshold voltage of each of the transistors Q1 to Q12 (N channel-MOSFETs) is represented by Vthn.

(1) First, both the first bit line 1a and the second bit line 1b are precharged to Vcc. Although the precharging path is not shown, each of the bit lines 1a and 1b is connected to the supply potential Vcc through a transistor which is turned on by a precharge signal, and a constant voltage supply $V_{R1}$ is set at a level of (Vcc+Vthn). In this state, since the potential difference between the gate of the transistor Q3 and the first bit line 1a is as follows;

$$Vcc+Vthn)-Vcc=Vthn,$$

the transistor Q3 is substantially cut-off. Similarly, the transistor Q4 is also substantially cut-off. The constant voltage supply $V_H$ is set at a potential (for example, 7 V) higher than Vcc ($V_H$>Vcc).

(2) At time t1, the clock signal $\phi 1$ is raised to the "H" level, and a potential V1 of the clock signal $\phi 1$ is set to be ($V_H$+Vthn) or more (V1≦$V_H$+Vthn). Consequently, the transistors Q1 and Q2 are rendered conductive, so that the first and second nodes N1 and N2 rise in potential, to be precharged to $V_H$. During this period, the transistors Q5 to Q8 are non-conductive.

(3) At time t2, the clock signal $\phi 1$ is lowered to the "L" level so that the transistors Q1 and Q2 are rendered non-conductive, to terminate precharging of the nodes N1 and N2.

(4) At time t3, the word line WL1 in the memory cell 2a having the capacitor C4 storing Vcc and the dummy word line DWL2 in the dummy cell 3b having the capacitor C2 storing 0 V are made to be the "H" level in response to the external address. Consequently, the transistors Q11 and Q12 are rendered conductive so that information of Vcc is read out onto the first bit line 1a from the capacitor C4. However, since the first bit line 1a is precharged to Vcc, a potential on the first bit line 1a remains at Vcc.

On the other hand, a potential Vcc on the second bit line 1b is decreased by ½ΔV, to be (Vcc−½ΔV). Thus, the potential difference between the first bit line 1a and the second bit line 1b becomes ½ΔV. Here, ΔV is represented by;

$$\Delta V = \frac{C4}{C_{Ba}+C4} \cdot Vcc, \quad (1)$$

where $C_{Ba}=C_{Bb}$, $C_{Sa}=C_{Sb}$, C3=C4=2C1=2C2.

When the potential on the second bit line 1b becomes (Vcc−½ΔV), the potential difference between the gate of the transistor Q4 and the second bit line 1b becomes as follows;

$$(Vcc+Vthn)-(Vcc-\tfrac{1}{2}\Delta V)=Vthn+\tfrac{1}{2}\Delta V,$$

so that the transistor Q4 is rendered conductive. As a result, charges stored on the second node N2 are transferred to the second bit line 1b. This charge transfer continues until the transistor Q4 is turned off, i.e., until the potential on the second bit line 1b rises by ½ΔV. As a result, charges of $C_{Bb}\cdot\Delta V/2$ are transferred from the second node N2 to the second bit line 1b, to lower the potential of the second node N2 by $\Delta V\cdot C_{Bb}/2C_{Sb}$. Consequently, the potential difference of $\Delta V\cdot C_{Bb}/2C_{Sb}$ is produced between the first node N1 and the second node N2.

In general, the relation $C_{Bb}>C_{Sb}$ is satisfied. Thus, even if the potential difference between the first bit line 1a and the second bit line 1b is small, i.e., ½ΔV, the potential difference between the first node N1 and the second node N2 becomes significantly larger than ½ΔV.

(5) At time t4, when the clock signal $\phi 2$ is made to attain the "H" level relatively slowly, the transistor Q8 is rendered conductive, so that a potential of the node N3 is lowered from $V_H$−Vthn) to a ground potential (0 V). Consequently, the cross-coupled transistors Q6 and Q7 (or the flip-flop type sense amplifier) are activated. More specifically, from the relation between the magnitudes of the potentials of the nodes N2 and N1 applied to the gates of the transistors Q6 and Q7, the transistor Q7 is more conductive than the transistor Q6 is, so that charges stored on the second node N2 are rapidly discharged from the transistor Q7 to ground through the node N3 and the transistor Q8. Consequently, the potential of the second node N2 becomes 0 V in a short time. On the other hand, the transistor Q6 which is first weakly conductive is quickly rendered non-conductive due to the drop in the potential of the node N2. Therefore, read data is amplified.

After the potentials on the bit lines 1a and 1b are established, the transfer gates T1 and T2 are rendered conductive by the output of the column decoder CD, so that the bit lines 1a and 1b are connected to the data input/output buses I/O and Ī/Ō, respectively. Consequently, accessed memory cell information is read out.

(6) At time t5, the word line WL1 is made to attain the "L" level so that the transistor Q11 is rendered non-conductive, to finish reading out information from the memory cell 2a. At the time immediately before that, the first bit line 1a was at the potential of Vcc and the capacitor C4 in the memory cell 2a was maintained at the original potential of Vcc. Restoring of data thus is achieved, whereby the stored content is held at a control level.

(7) At time t6, the dummy word line DWL2 is made to attain the "L" level so that the transistor Q10 is rendered non-conductive. At the time immediately before that, the second bit line 1b remains at 0 V, and the capacitor C2 in the dummy cell 3b remains at the original potential of 0 V.

(8) At time t7, the clock signal $\phi 2$ is made to attain the "L" level so that the transistor Q8 is rendered non-conductive. At the same time, the clock signal $\phi 3$ is made to attain the "H" so that the transistor Q5 is rendered conductive. The first node N1 and the second node N2 are equalized in response to the conduction state of the transistor Q5. Consequently, one cycle of the read operation is completed.

[2] Reading out stored information of "L" level

It is assumed that information of the "L" level, i.e., 0 V is stored in the capacitor C4 in the memory cell 2a, and the content thereof is read out.

(1) First, the potentials on the first bit line 1a and the second bit line 1b are Vcc, and the potential of the constant voltage supply $V_{R1}$ is (Vcc+Vthn), and the transistors Q3 and Q4 are in the nearly cut-off state. In addition, the constant voltage $V_H$ is higher than Vcc.

(2) At the time t1, the clock signal $\phi 1$ is made to be the "H" level so that the transistors Q1 and Q2 are rendered conductive, thereby to precharge to $V_H$ the nodes N1 and N2. During this period, the transistors Q5 to Q8 are non-conductive.

(3) At the time t2, the clock signal $\phi 1$ is lowered to the "L" level so that the transistors Q1 and Q2 are rendered non-conductive.

(4) At the time t3, the word line WL1 in the memory cell 2a and the dummy word line DWL2 in the dummy cell 3b are made to attain the "L" level. Consequently, the transistor Q11 is rendered conductive, so that the potential on the first bit line 1a is lowered to (Vcc−ΔV) and the potential on the second bit line 1b is lowered to (Vcc−½ΔV). In other words, the potential difference between the first bit line 1a and the second bit line 1b becomes −½ΔV. This potential difference has a sign opposite to that in the case in which the memory cell 2a stores information of the "H" level.

When the potential on the first bit line 1a becomes (Vcc−ΔV), the potential difference between the gate of the transistor Q3 and the first bit line 1a is as follows;

$$Vcc+Vthn-(Vcc-\Delta V)=Vthn+\Delta V,$$

so that the transistor Q3 is rendered conductive. As a result, charges stored in the first node N1 are transferred to the first bit line 1a. This charge transfer continues until the transistor Q3 is turned off. Thus, charges of $C_{Ba}\cdot\Delta V$ are transferred from the first node N1 to the first bit line 1a, so that the potential of the first node N1 is decreased by $\Delta V \cdot C_{Ba}/C_{Sa}$.

On the other hand, the potential on the second bit line 1b is (Vcc−½ΔV), which is the same as that in the above described case in which stored information of the "H" level is read out, so that the same operation is performed. More specifically, the transistor Q4 is rendered conductive until charges of $C_{Bb}\cdot\frac{1}{2}\Delta V$ are transferred from the second node N2 to the second bit line 1b, so that the potential of the second node N2 is decreased by;

$$\tfrac{1}{2}\Delta V \cdot C_{Bb}/C_{Sb} = \tfrac{1}{2}\Delta V \cdot C_{Ba}/C_{Sa}$$

As a result of the foregoing, the potential difference of $-\frac{1}{2}\Delta V \cdot C_{Ba}/C_{Sa}$ is produced between the first node N1 and the second node N2. This potential difference has a sign opposite to that in the case in which the memory cell 2a stores information of the "H" level.

Thus, even if the potential difference between the first bit line 1a and the second bit line 1b at the beginning of the read operation is very small, i.e., $-\frac{1}{2}\Delta V$, the potential difference between the first node N1 and the second node N2 becomes significantly larger than $-\frac{1}{2}\Delta V$.

(5) At the time t4, when the clock signal $\phi 2$ is made to attain the "H" level, the transistor Q8 is rendered conductive, so that the potential of the node N3 is lowered from ($V_H$−Vthn) to ground potential (0 V). Consequently, the cross-coupled transistors Q6 and Q7 of the flip-flop type sense amplifier are activated. In this case, the relation between the potentials of the nodes N2 and N1 applied to the gates of the transistors Q6 and Q7 is opposite that in the above described case in which the stored information of the "H" level is read out. More specifically, since the potential of the first node N1 is lower than the potential of the second node N2, the transistor Q6 is more conductive than the transistor Q7, so that the charges stored in the first node N1 are rapidly discharged through the transistor Q6 to ground through the node N3 and the transistor Q8, whereby the potential of the first node N1 becomes 0 V in a short time. On the other hand, the transistors Q7 which is first weakly conductive is quickly rendered non-conductive due to the drop in the potential of the node N1. Consequently, read data is amplified.

(6) After that, in the above described manner, restoring to the memory cell 2a and the dummy cell 3a and equalizing of the nodes N1 and N2 are performed.

The conventional charge-transfer sense amplifier had the above described configuration. However, in recent years, has become a major trend in a sensing scheme of the MOS dynamic RAM that a precharge potential on a bit line is made to be ½Vcc from the viewpoint of reduction in the power consumption and fast operation. In addition, a scheme for precharging the bit line to ½Vcc actually has good matching with the sense amplifier of a CMOS structure.

Now, consider the case in which the scheme for precharging the bit line to (½)Vcc is applied to the above described conventional charge-transfer sense amplifier without any modification.

It is assumed that the first bit line 1a and the second bit line 1b are precharged to (½)Vcc and the first node N1 and the second node N2 are precharged to, for example, 5 V in response to the clock signal $\phi 1$. On this occasion, the potential of the constant voltage supply $V_{R1}$ is set at (½Vcc+Vthn) so that the transistors Q3 and Q4 are in the nearly cut-off state. Additionally, in the scheme for precharging the bit line to (½)Vcc, the dummy cell is generally always charged such that the potential thereof becomes (½)Vcc.

When information of the "H" level, i.e., Vcc, stored in the memory cell 2a is read out, the second bit line 1b remains at (½)Vcc and the potential on the first bit line 1a rises by $\frac{1}{2}\Delta V = \frac{1}{2} Vcc \cdot C_4/(C_{Ba}+C_4)$. However, since the transistors Q3 and Q4 remain non-conductive, charges are not transferred.

More specifically, since the following relation is satisfied;

$$V_{R1} = \tfrac{1}{2}Vcc + Vthn,$$

the potential difference between the gate and the source of the transistor Q3 is as follows;

$$\begin{aligned} V_{R1} - \tfrac{1}{2}\Delta V &= (\tfrac{1}{2}Vcc + Vthn) - \left(\frac{\tfrac{1}{2}Vcc \cdot C_4}{C_4 + C_{Ba}}\right) \\ &= \tfrac{1}{2}Vcc \cdot \frac{C_{Ba}}{C_4 + C_{Ba}} + Vthn \\ &\approx \tfrac{1}{2}Vcc + Vthn \quad (C_{Ba} >> C_4), \end{aligned}$$

and the potential difference between the gate and the source of the transistor Q4 is as follows;

$$V_{R1} - \tfrac{1}{2}Vcc = \tfrac{1}{2}Vcc + Vthn - \tfrac{1}{2}Vcc = Vthn.$$

Thus, both the transistors Q3 and Q4 are in the nearly cut-off state, so that charges can not be transferred.

Additionally, in order to transfer charges on the second node N2 to the second bit line 1b, the potential of the constant voltage supply $V_{R1}$ must be set higher than ($\frac{1}{2}Vcc+Vthn$). If the potential of the constant voltage supply $V_{R1}$ is thus set, both the transistors Q3 and Q4 are rendered conductive in the precharge period. More specifically, during the precharge period, the potential on each of the bit lines 1a and 1b becomes $\frac{1}{2}Vcc$. Consequently, if $V_{R1} > \frac{1}{2}Vcc+Vthn$, the potential difference between the gate and the source of each of the transistors Q3 and Q4 becomes larger than Vthn. Thus, the transistors Q3 and Q4 are changed from substantially the cut-ff state to the conductive state in a linear region, so that charges are transferred.

To be incorporated in the one-half Vcc precharge scheme for precharging the bit line to $\frac{1}{2}Vcc$ commonly employed in the recent large capacity DRAM, as described above, the conventional charge-transfer sense amplifier must disadvantageously be modified.

Thus, it is desired to provide a charge-transfer sense amplifier applicable to the DRAM with bit lines precharged to one-half Vcc potential.

SUMMARY OF THE INVENTION

An object of the present invention is to provide a charge-transfer sense amplifier applicable to a DRAM with bit lines precharged to one-half Vcc potential.

Another object of the present invention is to provide an operating method therefor.

The charge transfer sense amplifier according to the present invention comprises, in addition to the configuration of the conventional charge-transfer sense amplifier, a pair of coupling capacitances for cross-coupling the gates of charge transfer elements and the bit lines, and precharge circuitry for precharging the gates of the charge transfer elements to a predetermined potential.

A precharge potential applied to the respective gates of the charge transfer elements is a potential at which the charge transfer elements remains in substantially a cut-off state.

In the above described structure, the charge transfer elements are brought into substantially the cut-off state and are cross-coupled to the bit lines through the coupling capacitances. Therefore, at the time of reading out information, the potential shift which appears on each of the bit lines is applied to each of the gates of the charge transfer elements through each of the coupling capacitances. As a result, the charge transfer element having its gate capacitively coupled to a bit line at a higher potential is rendered conductive because the potential difference between the gate and a bit line at a lower potential becomes larger than that at the precharging time. On the other hand, the charge transfer element having its gate capacitively coupled to the bit line at a lower potential is rendered non-conductive because the potential difference between the gate and the bit line at a higher potential becomes smaller than at the precharging time. Thus, the charge transfer is caused only from a corresponding node in a flip-flop type sense amplifier to the bit line at a lower potential. Consequently, a potential of each of the latching nodes in the flip-flop type sense amplifier corresponds to the information as read out, and the potential difference therebetween is the same as that obtained by amplifying the potential difference between the bit lines.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
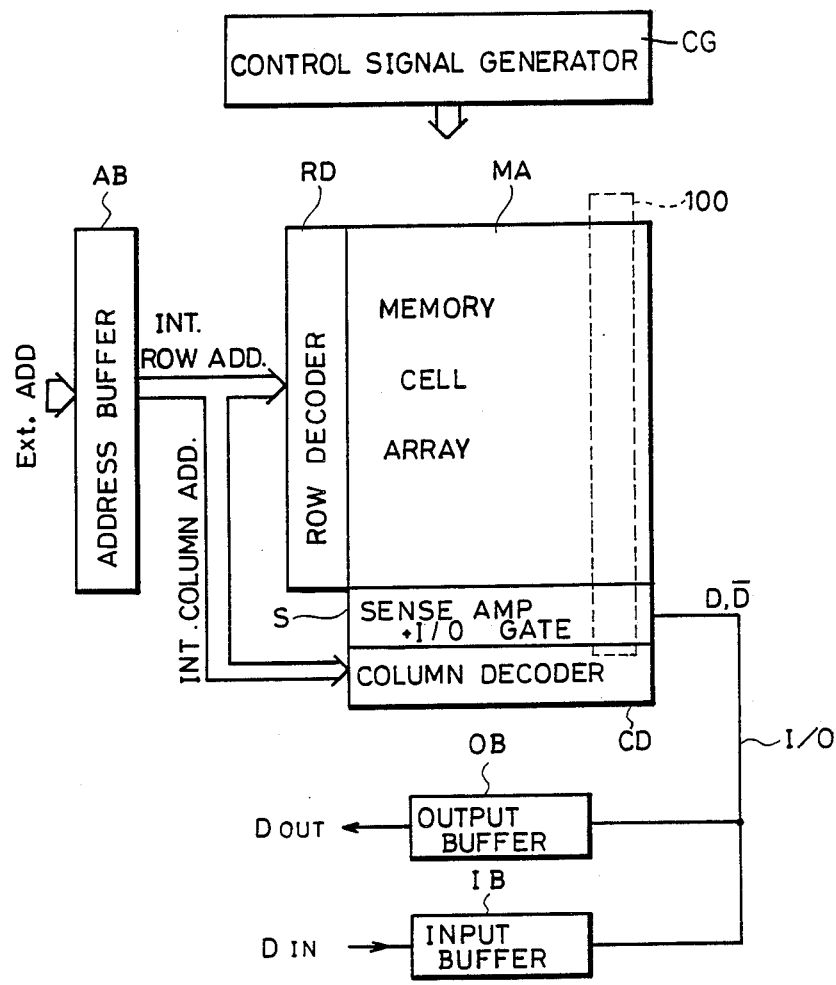
FIG. 1 is a schematic diagram showing structure and arrangement of the whole of a general DRAM.
Figure 2:
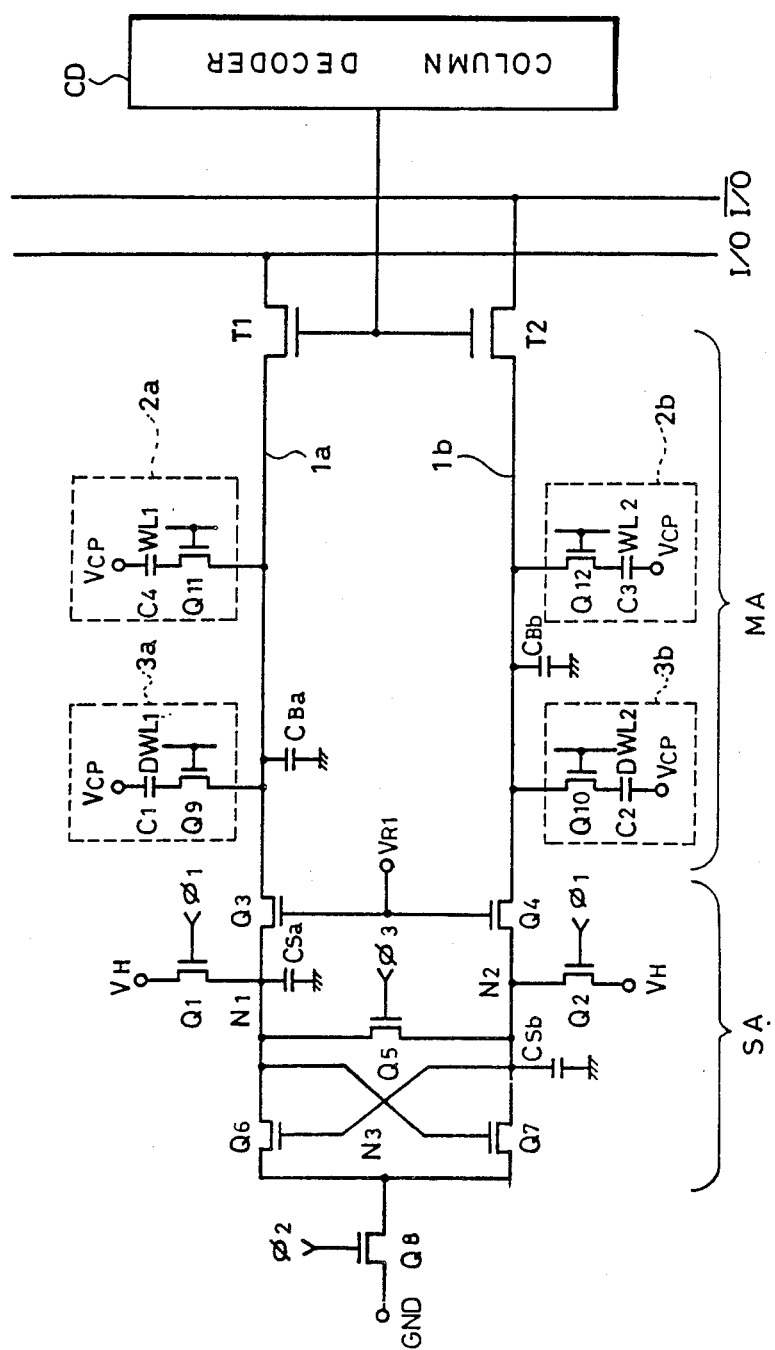
FIG. 2 is a diagram showing structure of a conventional charge-transfer sense amplifier, showing a pair of bit lines and portions related thereto.
Figure 4:
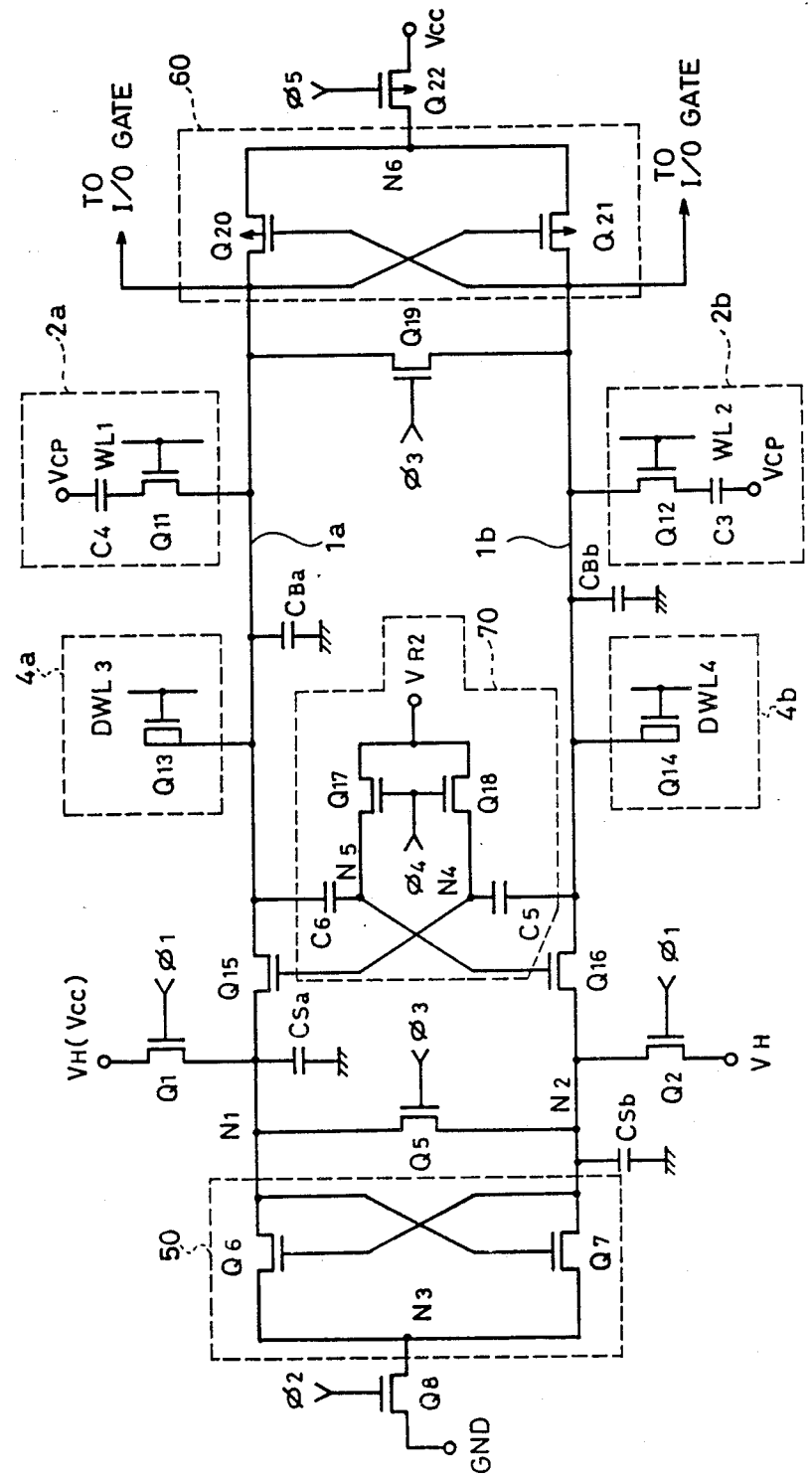
FIG. 4 is a diagram showing structure of a charge-transfer sense amplifier according to an embodiment of the present invention, showing a pair of bit lines and portions related thereto.

In FIG. 4, portions corresponding to those in the structure of the conventional charge-transfer sense amplifier shown in FIG. 2 have the same reference numerals.

A pair of bit lines 1a and 1b has a folded bit line configuration, in which one line of a pair of bit lines provides a reference potential in sensing a signal voltage on the other of the paired bit lines.

A predetermined plurality of memory cells and a single dummy cell are connected to the bit lines 1a and 1b, respectively. In FIG. 4, a memory cell 2a provided at an intersection of a word line WL1 and the first bit line 1a and a memory cell 2b provided at an intersection of a word line WL2 and the second bit line 1b are representatively shown. Each of the memory cells 2a and 2b comprises a single transfer gate transistor and a single capacitor. More specifically, the memory cell 2a comprises an n channel MOS transistor Q11 serving as a transfer gate and a capacitor C4. The memory cell 2b comprises an n channel MOS transistor Q12 serving as a transfer gate and a capacitor C3. Respective cell plates of the storage capacitors C3 and C4 which store binary information in the form of charges are coupled to a predetermined potential Vcp.

Dummy cells 4a and 4b comprise noise cancelling elements Q13 and Q14, respectively. As a noise cancelling element, a capacitor, or one MOS transistor can be employed. Each of the dummy cells 4a and 4b is provided to capacitively couple a word line and a bit line. More specifically, when a potential on a selected word line rises, the potential on the word line is transmitted onto a bit line through a parasitic capacitance between the bit line and the word line (a gate capacitance of a transistor in a memory cell), so that a potential on the bit line changes (rises). In order to prevent the shift of the potential on the bit line due to the capacitive coupling between the word line and the bit line, a noise cancelling element having substantially the same capacitance as the parasitic capacitance between the word line and the bit line (the gate capacitance of the transistor in the memory cell) is provided on each bit line. At that time, if a potential on a dummy word line DWL3 is lowered when the word line WL1, for example, is selected and the potential thereof rises, coupling noise caused by a parasitic capacitance between the word line WL1 and the bit line 1a and coupling noise caused by a parasitic capacitance between a dummy word line DWL3 and the bit line 1a are cancelled by each other.

In reading out information, in order to lower a bit line at a lower potential, of the bit lines 1a and 1b, to an "L" level of a ground potential, a flip-flop type sense amplifier 50 comprising cross-coupled n channel MOS transistors Q6 and Q7 is provided. In addition, in order to charge a bit line at a higher potential to a Vcc level of a supply potential, there is provided a restore circuit 60 comprising cross-coupled p channel MOS transistors Q20 and Q21.

The sense amplifier 50 is activated by an n channel MOS transistor Q8 responsive to a clock signal $\phi 2$.

The restore circuit 60 is activated by a p channel MOS transistor Q22 responsive to a clock signal $\phi 5$.

An n channel MOS transistor (first switching element) Q15 for charge transfer is provided between a first latching point of the sense amplifier 50 and the first bit line 1a. An n channel MOS transistor (second switching element) Q16 is provided between a second latching point of the sense amplifier 50 and the second bit line 1b.

In order to precharge a node N1 to a first predetermined potential $V_H$ ($V_H \approx Vcc$), there is provided an n channel MOS transistor Q1 responsive to a clock signal $\phi 1$. The high level of the clock signal $\phi 1$ is $V_H + Vthn$ (where Vthn is a threshold voltage of an n channel MOS transistor). The potential $V_H$ ($V_H \approx Vcc$) is applied to the node N1 through the transistor Q1 in an on state.

In order to precharge a node N2 to the predetermined potential $V_H$, there is provided an n channel MOS transistor Q2 responsive to the clock signal $\phi 1$ for coupling the node N2 to the predetermined potential $V_H$.

In order to equalize potentials of the nodes N1 and N2, there is provided an n channel MOS transistor Q5 responsive to a clock signal $\phi 3$ for short-circuiting the nodes N1 and N2.

Similarly, in order to equalize potentials on the bit lines 1a and 1b, there is provided an n channel MOS transistor Q19 responsive to the clock signal $\phi 3$ for short-circuiting the bit lines 1a and 1b.

Furthermore, in order to provide the charge transfer elements Q15 and Q16 with full function even in a one-half Vcc precharge scheme, there is provided a precharge block 70 for precharging the gate of the elements Q15 and Q16 to a second predetermined potential $V_{R2}$. The precharge block 70 comprises a capacitance C5 for capacitively coupling a gate of the transistor Q15 for charge transfer to the second bit line 1b, a capacitance C6 for capacitively coupling a gate of the transistor Q16 for charge transfer to the first bit line 1a, and n channel MOS transistors Q18 and Q17 responsive to a clock signal $\phi 4$ for transmitting to the gates (nodes N4 and N5) of the transistors Q15 and Q16 the predetermined potential $V_{R2}$ ($\approx \frac{1}{2}Vcc + Vthn$), respectively. The capacitances C5 and C6 are equal in capacitance value.

There exist parasitic capacitances $C_{Ba}$ and $C_{Bb}$ associated with the bit lines 1a and 1b, respectively.

There exist also parasitic capacitances $C_{Sa}$ and $C_{Sb}$ associated with the nodes N1 and N2, respectively.

Figure 5:
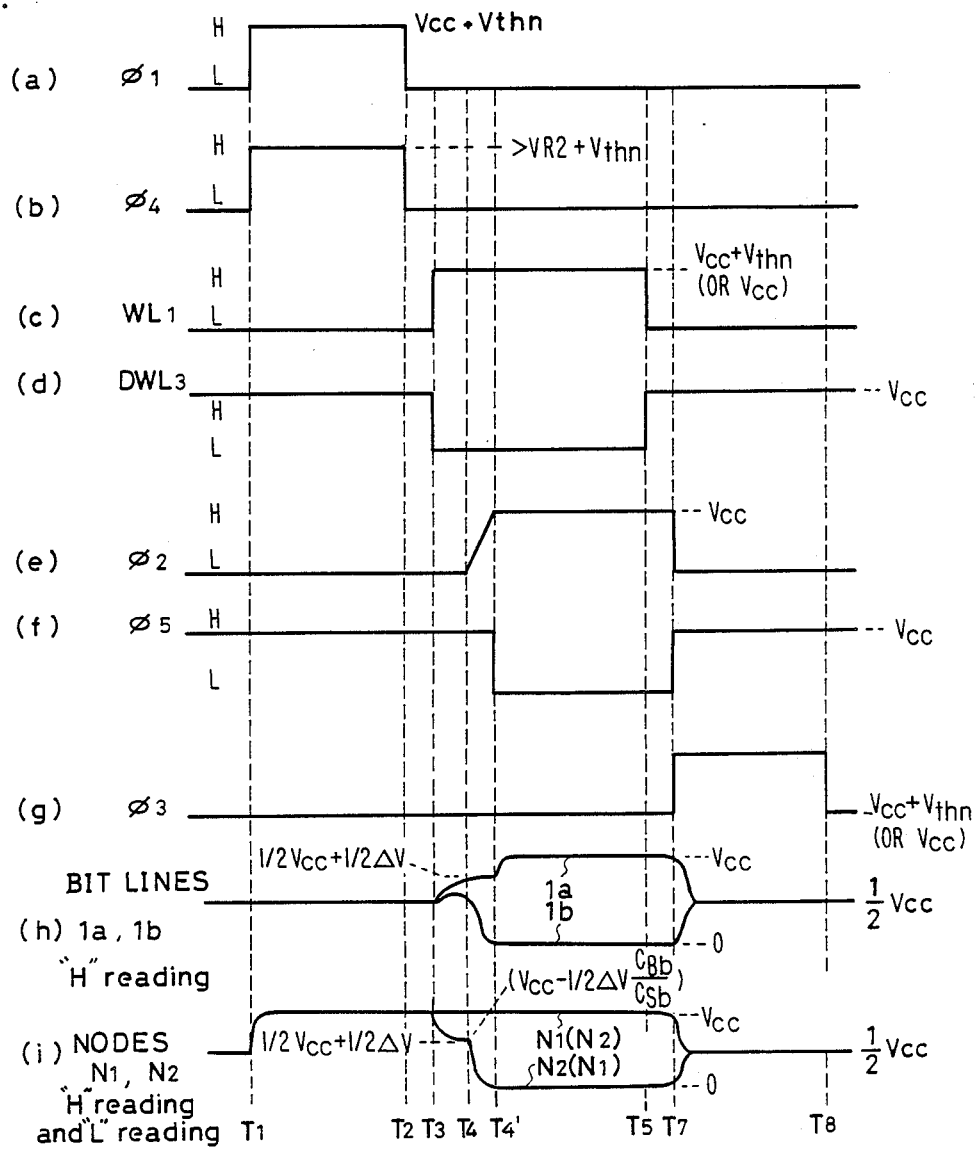
FIG. 5 is a waveform diagram showing an operation of the charge transfer sense amplifier according to the present invention, showing signal waveforms at the time of reading out data.

Referring now to the waveform diagram of FIG. 5, description is made of an operation of a charge-transfer sense amplifier according to an embodiment of the present invention. In the following description, it is assumed that all n channel MOS transistors have the same threshold voltage, Vthn, and all p channel MOS transistors have the same threshold voltage, Vthp.

[1] Reading out stored information of "H" level

Description is made where information of the "H" level, i.e., charges of a Vcc level are stored in the capacitor C4 in the memory cell 2a, and the memory cell 2a is selected.

(1) Before the time t1, both the bit lines 1a and 1b and the nodes N1 and N2 are precharged to $\frac{1}{2}$Vcc. This precharging is achieved by rendering the transistors Q5 and Q19 conductive in response to the clock signal $\phi 3$. FIG. 5 shows a case in which the equalizing is achieved after completion of a read cycle. This equalizing/precharging to $\frac{1}{2}$Vcc is completed before the time t2 at latest.

Node N6 is at Vcc at the time of completion of the previous cycle.

Since the clock signal $\phi 5$ is at the "H" level and the transistor Q22 is turned off, the potential of the node N6 becomes ($\frac{1}{2}$Vcc + Vthp).

(2) At the time t1, when the clock signal $\phi 1$ rises to a (Vcc + Vthn) level ($V_H \approx Vcc$), the transistors Q1 and Q2 are rendered conductive, so that the nodes N1 and N2 are precharged to the Vcc level. Since the clock signal $\phi 2$ is at the "L" level and the transistor Q8 is non-conductive, the potential of the node N3 attains the value (Vcc − Vthn). At the same time t1, when the clock signal $\phi 4$ rises, the transistors Q17 and Q18 are rendered conductive, so that both the nodes N4 and N5 are precharged to $V_{R2}$ ($\approx \frac{1}{2}$Vcc + Vthn). On the other hand, the transistors Q15 and Q16 are non-conductive (in a close-to-cut off state), so that charges are not transferred.

(3) At the time t2, when the clock signal $\phi 1$ falls to the "L" level, the transistors Q1 and Q2 are rendered non-conductive, so that precharging of the nodes N1 and N2 to the Vcc level is completed. At the same time, the clock signal $\phi 4$ falls to the "L" level, so that the transistors Q17 and Q18 are rendered non-conductive, whereby precharging of the nodes N4 and N5 is completed.

Figure 3:
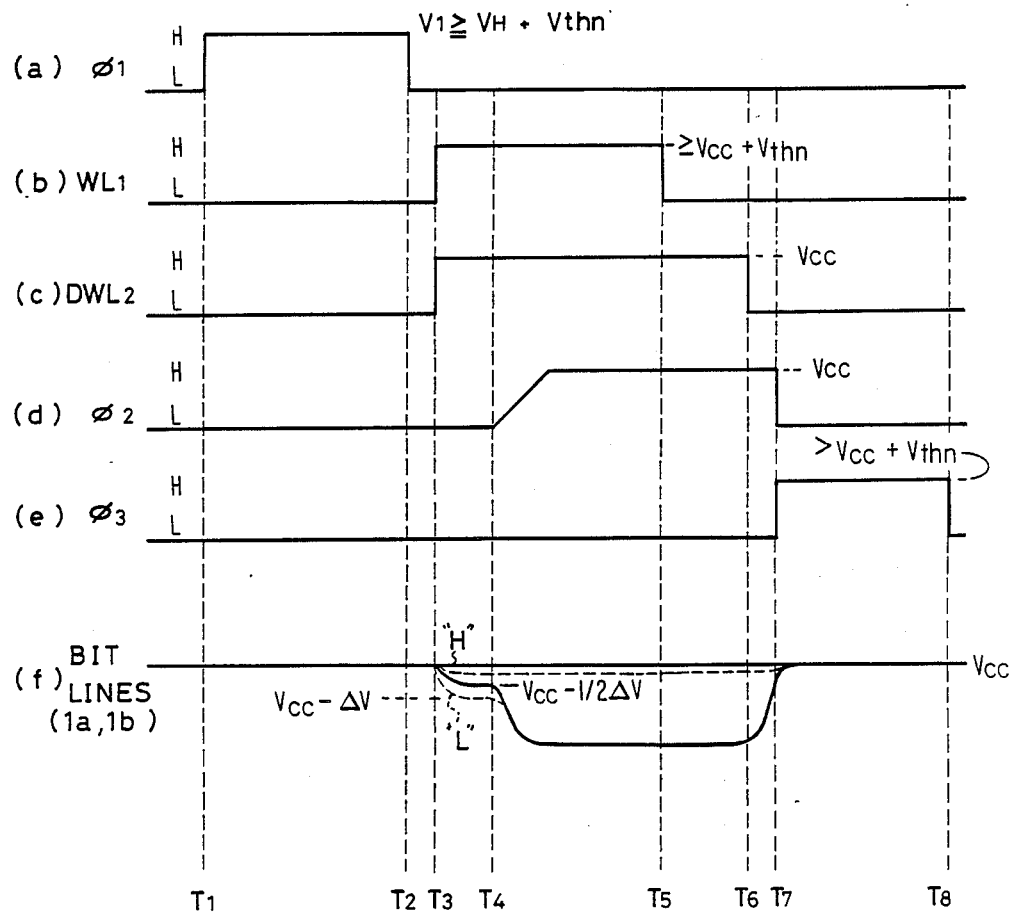
FIG. 3 is a waveform diagram showing an operation of the conventional charge-transfer sense amplifier, showing signal waveforms at the time of reading out data.

(4) At the time t3, the potential on the selected word line WL1 rises to the "H" level of the potential on the dummy word line DWL3 falls from the "H" level to the "L" level, based on an externally applied address. As a result, information of the "H" level stored in the memory cell 2a is transmitted onto the first bit line 1a, so that the potential on the bit line 1a rises from $\frac{1}{2}$Vcc to ($\frac{1}{2}$Vcc + $\frac{1}{2}\Delta V$) ($\Delta V$ is given by the equation (1) discussed previously in conjunction with FIG. 3. On the other hand, since the selected memory cell is not connected to the second bit line 1b, the potential on the second bit line 1b remains at $\frac{1}{2}$Vcc of the precharge level. The potential shift which appears on the bit line 1a is assumed to be not $\Delta V$ but $\frac{1}{2}\Delta V$ for the following reason. More specifically, in the one-half Vcc precharge scheme, available signal charges are $\frac{1}{2}\Delta V$, as in the full Vcc precharge scheme. For example, assuming that there is provided a dummy cell as in the full Vcc precharged scheme and the dummy cell stores information charges of $\frac{1}{2}$Vcc, the value of the potential shift on the bit line with reference to the dummy cell becomes $\frac{1}{2}\Delta V$. Thus, in order to establish a correspondence with the discussion of the operation of the conventional charge-transfer sense amplifier employed in the full Vcc precharge scheme, it is assumed that the potential shift on the bit line at the time of reading out information (before a sense operation) is $\frac{1}{2}\Delta V$.

The potential shift of $\frac{1}{2}\Delta V$ on the first bit line $1a$ raises the potential of the fourth node N5 from the precharge level of ($\frac{1}{2}Vcc+Vthn$) to ($\frac{1}{2}Vcc+Vthn+\frac{1}{2}\Delta V$). Consequently, the transistor Q16 is rendered conductive. On the other hand, since the potential on the second bit line $1b$ is not changed, the potential of the third node N4 remains at ($\frac{1}{2}Vcc+Vthn$).

Charges are transferred from the second node N2 to the second bit line $1b$ in response to the conduction state of the transistor Q16. This charge transfer through the transistor Q16 continues until the transistor Q16 is rendered non-conductive (or in the close-to-cut off state). More specifically, the charge transfer continues until the potential on the second bit line $1b$ becomes ($\frac{1}{2}Vcc+\Delta V'$) ($\Delta V' \approx \frac{1}{2}\Delta V$). As a result, charges of $(C_{Bb}+C5) \cdot \frac{1}{2}\Delta V$ are transferred from the second node N2 to the second bit line $1b$ and the first capacitance C5. In general, since $C_{Bb} >> C5$, the amount of charge as transferred become as follows;

$$(C_{Bb}+C5) \cdot \frac{1}{2}\Delta V \approx \frac{1}{2} C_{Bb} \cdot \Delta V.$$

At the beginning of the charge transfer when the transistor Q16 starts to be rendered conductive, the potential difference between the third node N4 and the first bit line $1a$ becomes as follows;

$$(\frac{1}{2}Vcc+Vthn)-(\frac{1}{2}Vcc+\frac{1}{2}\Delta V) = |Vthn-\frac{1}{2}\Delta V|.$$

In the conventional full Vcc precharge scheme, the potential difference between the constant voltage supply $V_{R1}$ ($\approx Vcc+Vthn$) and the first bit line $1a$ is Vthn. On the other hand, in the present embodiment, the potential difference therebetween becomes smaller, i.e., $|Vthn-\frac{1}{2}\Delta V|$. Thus, margin for the conduction of the transistor Q15 is obtained by this decreased value, so that the transistor Q15 is made harder to be conductive in the period of the charge transfer from the second node to the second bit line $1b$ which is caused by the conduction of the transistor Q16.

As a result of this charge transfer from the node N2 to the second bit line $1b$ through the transistor Q16, the potential of the second node N2 is lowered by $\frac{1}{2}\Delta V \cdot C_{Bb}/C_{Sb}$. Thus, the potential difference between the first node N1 and the second node N2 becomes $\frac{1}{2}\Delta V \cdot C_{Bb}/C_{Sb}$. In general, the relation $C_{Bb} >> C_{Sb}$ is satisfied. Thus, similarly to the conventional example, the function that a considerable large potential difference can be produced between the first node N1 and the second node N2, even in a very small potential difference between the first bit line $1a$ and the second bit line $1b$, i.e., $\frac{1}{2}\Delta V$, is maintained in the scheme for precharging the bit lines to $\frac{1}{2}Vcc$.

(5) At time t4 when the potential difference between the nodes N1 and N2 becomes considerably large, if the clock signal $\phi 2$ is gently raised to the "H" level, the transistor Q8 is rendered conductive. Consequently, the sense amplifier 50 comprising the cross-coupled transistors Q6 and Q7 is activated, so that the potential difference between the nodes N1 and N2 is rapidly increased (the node N2 is discharged to the ground potential).

(6) At the time t4' (t4<t4'<t5), when the clock signal $\phi 5$ falls from the "H" level to the "L" level, the transistor Q22 is rendered conductive, so that the restore circuit 60 comprising the cross-coupled transistor Q20 and Q21 is activated. Consequently, the potential on the first bit line $1a$ rapidly rises to the Vcc level. On the other hand, at the time t4', the transistor Q8 is conductive, so the potential of the second node N2 attains ground potential (0 V) by the function of the activated sense amplifier 50. The potential difference between the gate (node N5) of the transistor Q16 and the node N2 is ($\frac{3}{2}Vcc+\frac{1}{2}\Delta V+Vth$) or more. In addition, the potential on the second bit line $1b$ is equal to approximately $\frac{1}{2}Vcc+\frac{1}{2}\Delta V$. Furthermore, the rise of the potential on the bit line $1a$ causes the potential of the node N5 to rise through the coupling capacitance C6. Thus, the transistor Q16 is rendered more conductive. Consequently, the second bit line $1b$ is rapidly discharged through the transistor Q16 to ground potential (0 V) through the transistor Q16.

Therefore, the potentials on the first bit line $1a$ and the second bit line $1b$ are amplified to the Vcc level and 0 V, respectively. The difference between the amplified potentials is transferred through the I/O gate onto an I/O bus by a signal from a column decoder (not shown), so that information is read out.

(7) At the time t5, the word line WL1 level is made to attain the "L" level so that the transistor Q11 is rendered non-conductive, while the dummy word line DWL3 is returned to the "H" level. Consequently, the Vcc level on the bit line $1a$ has been written into the memory cell $2a$, so that the capacitor C4 in the memory cell $2a$ restores the original Vcc level.

(8) At the time t7, the clock signal $\phi 2$ is made to attain the "L" level so that the transistor Q8 is rendered non-conductive, and also the clock signal $\phi 5$ is made to attain the "H" level so that the transistor Q22 is rendered non-conductive. At the same time, the clock signal $\phi 3$ is made to attain the "H" level so that the transistors Q5 and Q19 are rendered conductive, to equalize to $\frac{1}{2}Vcc$ the potentials of the first node N1, the second node N2, the first bit line $1a$ and the second bit line $1b$. Thereafter, at the time t8, the clock signal $\phi 3$ is lowered so that the transistors Q5 and Q19 are rendered non-conductive. Consequently, one cycle of the read operation is completed.

[2] Reading out stored information of "L" level

Description is now made on a case in which information of the "L" level, i.e., 0 V, is stored in the capacitor C4 in the memory cell $2a$, and the content thereof is read out. In FIG. 5, the potentials on the bit lines $1a$ and $1b$ in this case are not shown. The potentials of the nodes N1 and N2 are shown in parentheses in the figure. Before the time t3, the same operation is performed as the case in which the stored information of the "H" level is read out.

At the time t3, when the word line WL1 in the memory cell $2a$ reaches the "H" level and the dummy word line DWL3 reaches the "L" level, the potential on the first bit line $1a$ falls from $\frac{1}{2}Vcc$ to ($\frac{1}{2} \cdot Vcc - \frac{1}{2} \cdot \Delta V$). On the other hand, since a memory cell does not exist at an intersection of the second bit line $1b$ and the word line WL1, the potential on the second bit line $1b$ remains at $\frac{1}{2}Vcc$ of the precharge level.

The potential shift ($-\frac{1}{2}\Delta V$) in the first bit line $1a$ lowers the potential of the fourth node N5 from ($\frac{1}{2}Vcc+Vthn$) to ($\frac{1}{2}Vcc+Vthn-\frac{1}{2}\Delta V$) through the second capacitance C6. In this state, the potential difference between the gate (node N5) of the transistor Q16 and the second bit line $1b$ become as follows;

$$(\frac{1}{2}Vcc+Vthn-\frac{1}{2}\Delta V)-\frac{1}{2} \cdot Vcc = Vthn-\frac{1}{2}\Delta V < Vthn.$$

so that the transistor Q16 remains non-conductive.

On the other hand, since the potential of the third node N4 is a precharged level, i.e., ($\frac{1}{2}$Vcc+Vthn), the potential difference between the gate (the node N4) of the transistor Q15 and the first bit line 1a is as follows;

$$(\tfrac{1}{2}Vcc+Vthn)-(\tfrac{1}{2}Vcc-\tfrac{1}{2}\Delta V)=Vthn+\tfrac{1}{2}\Delta V,$$

so that the transistor Q15 is rendered conductive, and charges are transferred from the node N1 to the first bit line 1a. This charge transfer continues until the transistor Q15 is rendered non-conductive, i.e., the potential on the first bit line 1a reaches $\frac{1}{2}$Vcc. As a result, charges of $\frac{1}{2}\cdot\Delta V\cdot(C_{Ba}+C6)$ are transferred from the node N1 to the first bit line 1a and the second capacitance C6. Since the relation $C_{Ba}>>C6$ is satisfied in general, the amount of the charges as transferred becomes approximately $\frac{1}{2}\cdot C_{Ba}\cdot V$.

Meanwhile, at the beginning of the conduction of the transistor Q15, the potential difference between the fourth node N5 and the second bit line 1b is (Vthn$-\frac{1}{2}\Delta V$) as described above, which is decreased by ($\frac{1}{2}\Delta V$), as compared with Vthn in the conventional example. Thus, margin for the transition to the conductive state is obtained by this value. Consequently, even in the period of the charge transfer from the first node N1 to the first bit line 1a, the transistor Q16 is not easily rendered conductive.

As a result of the charge transfer from the first node N1 to the first bit line 1a through the transistor Q15, the potential of the first node N1 falls by $\frac{1}{2}\Delta V\cdot C_{Ba}/C_{Sa}$. Consequently, the potential difference between the first node N1 and the second node N2 becomes $(-\frac{1}{2})\cdot\Delta V\cdot C_{Ba}/S_{Sa}$. The potential difference has an opposite sign to that in the case in which the accessed memory cell 2a stores information of the "H" level.

Thereafter, when the clock signal $\phi 2$ is raised at the time t4 and the clock signal $\phi 5$ is lowered at the time t4', the sense amplifier 50 comprising the cross-coupled transistors Q6 and Q7 and the restore circuit 60 comprising the cross-coupled transistors Q20 and Q21 are activated. Consequently, the first bit line 1a is discharged to the ground potential (0 V) through the transistors Q15 and Q6 while the second bit line 1b is charged to the Vcc level through the transistor Q21.

After the potential difference between the bit lines 1a and 1b is amplified, a read operation of information, a restore operation and an equalize operation are sequentially performed, similarly to the above described operation.

Although in the above described embodiment, description was made on a case in which the present invention is applied to the scheme for precharging the bit line to $\frac{1}{2}$Vcc, the present invention can be applied to a scheme for precharging the bit lines to an arbitrary voltage such as a Vcc precharge scheme, so that amplification of a very small signal, i.e., a sense operation with high sensitivity, can be effectively provided. In this case, it may be required to change the precharge potentials of the nodes N4 and N5 depending on the precharge potential on the bit line.

Furthermore, although in the above described embodiment, the present invention is applied to the sense amplifier in a dynamic RAM, the present invention may be applied to amplification of a very small signal in any electronic circuit (for example, a static RAM and a ROM), to obtain the same effect.

Additionally, the N-channel MOSFET and the P-channel MOSFET may be replaced with each other in a memory cell and a preamplifier and other circuity, to be driven by the complements of the above described clocks.

As described in the foregoing, according to the present invention, in the charge-transfer sense amplifier comprising charge transfer elements and a flip-flop type sense amplifier, the control gates of the charge transfer elements and the bit lines are cross-coupled to each other through coupling capacitances, while the respective gates of the charge transfer elements are precharged to a potential at which the charge transfer elements enter the nearly cut-off state. Thus, only a charge transfer element connected to a bit line at a lower potential transfers charges. Thus, even if the one-half Vcc precharge scheme or the like is provided with the charge-transfer sense amplifier, the charge transfer elements can be prevented from being rendered simultaneously non-conductive and being simultaneously rendered conductive. Consequently, the charge-transfer sense amplifier can be correctly operated even in the one-half Vcc precharge scheme or the like.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A charge-transfer sense amplifier receiving complementary signals on a pair of signal lines, comprising a flip-flop type latch circuit with a pair of latching nodes for amplifying a differential signal between said pair of signal lines; a pair of switching elements each having a source-drain connected between a respective one of said pair of signal lines and a corresponding one of said latching nodes of said latch circuit; and precharge elements for precharging said latching nodes to a predetermined first potential, each of said switching elements having a control gate;

coupling capacitances respectively connected between the control gate of each element in one line of said pair of signal lines and the other line of said pair of signal lines in a cross-coupled configuration, and means synchronized to the precharging of said latching nodes, for precharging the control gates of said pair of switching elements to a predetermined second potential different from and a value relative to said predetermined first potential sufficient to bring said switching elements into substantially a cut-off state.

2. The sense amplifier according to claim 1, wherein said pair of signal lines is precharged to a third predetermined potential V different from said first and second potentials at the time of precharging said latching nodes, and said second predetermined potential is at a level of (V+Vth), where threshold voltages of said switching elements are Vth.

3. The sense amplifier according to claim 2, wherein said pair of signal lines is a pair of bit lines in a dynamic random access memory to which memory cells in one column are connected, and further including means for precharging the pair of bit lines to one-half of an operating supply potential Vcc of said dynamic random access memory.

4. A dynamic random access memory having a plurality of memory cells arranged in a matrix of rows and columns, a plurality of bit lines each for designating an associated column of said memory cell matrix and arranged such that two bit lines constitute a pair to receive a pair of complementary signals, charge-transfer sense amplifiers provided respectively for said pairs of bit lines, a respective one of said charge-transfer sense amplifiers comprising a flip-flop type latch circuit with a pair of latching nodes for amplifying a differential signal between a corresponding pair of bit lines, a pair of switching elements, each having a source-drain path connected between a respective one of said latching nodes and a corresponding one of said bit lines, each one of said switching elements having a control gate, and precharging elements precharging said latching nodes to a first predetermined potential, each of said charge-transfer sense amplifiers further comprising:

coupling capacitances respectively connected between the control gate of each of said switching elements in one line of said pair of bit lines and the other line of said pair of bit lines, in a cross-coupled configuration, and means, synchronized to the precharging of said latching nodes, for precharging the control gates of said pair of switching elements to a second predetermined potential different from and of a value relative to said first predetermined potential sufficient to bring said switching elements in substantially a cut-off state.

5. The dynamic random access memory according to claim 4, wherein
said plurality of bit lines are precharged to a third potential V, each of said pair of switching elements has a threshold voltage Vth, and said second potential is set at a level of (V+Vth).

6. The dynamic random access memory according to claim 5, wherein
said third potential is one-half of Vcc, where Vcc is an operating supply potential of said dynamic random access memory.

7. A method for amplifying a differential signal between a pair of signal lines receiving complementary signals to each other using a flip-flop type latch circuit with a pair of latching nodes and a pair of switching elements, each of said switching elements having a source-drain path connected between a respective line of said signal lines and a corresponding one of said latching nodes, each of said switching elements having a control gate, said method comprising the steps of:

capacitively coupling the control gate of each of said switching elements in one line of said pair of signal lines to the other line of said pair of signal lines in a cross-coupled configuration;

precharging said pair of latching nodes to a first predetermined potential;

simultaneously with the precharging of said latching nodes, precharging the control gates of said switching elements to a second predetermined potential different from and having a value relative to the first predetermined potential sufficient to bring said switching elements into substantially a cut-off state; and applying a differential signal to be amplified to said pair of signal lines.

* * * * *